United States Patent [19]
Mogi

[11] Patent Number: 5,490,158
[45] Date of Patent: Feb. 6, 1996

[54] LASER UNIT

[75] Inventor: Shin Mogi, Kawasaki, Japan

[73] Assignee: Canon Kabushiki Kaisha, Tokyo, Japan

[21] Appl. No.: 186,607

[22] Filed: Jan. 26, 1994

[30] Foreign Application Priority Data

Jan. 29, 1993 [JP] Japan .................................. 5-013925

[51] Int. Cl.[6] ..................................................... H01S 3/02
[52] U.S. Cl. ............................................................. 372/36
[58] Field of Search ...................................... 372/36, 109

[56] References Cited

U.S. PATENT DOCUMENTS

| | | | |
|---|---|---|---|
| 4,912,715 | 3/1990 | Aoki et al. | 372/36 |
| 4,926,433 | 5/1990 | Imamura et al. | 372/50 |
| 5,052,005 | 9/1991 | Tanaka et al. | 372/36 |
| 5,113,404 | 5/1992 | Gaebe et al. | 372/36 |
| 5,247,530 | 9/1993 | Shigeno et al. | 372/36 |

FOREIGN PATENT DOCUMENTS

| | | |
|---|---|---|
| 510859 | 10/1992 | European Pat. Off. . |
| 61-095590 | 5/1986 | Japan . |
| 61-272987 | 12/1986 | Japan . |
| 1077985 | 3/1989 | Japan . |
| 3148190 | 6/1991 | Japan . |
| 3245586 | 11/1991 | Japan . |

*Primary Examiner*—James W. Davie
*Attorney, Agent, or Firm*—Fitzpatrick, Cella, Harper & Scinto

[57] ABSTRACT

A laser unit includes a semiconductor laser tip mounted on a substrate of a material such as Si, a monitoring photodiode, and a laser driving integrated circuit, all of which are fixed to a base member of a material, such as metal, by soldering or the like. Further, a collimator lens is fixed to the base member by using, for example, ultraviolet ray hardening resin. The base member is provided with a step or slope portion, or a cut-away portion, formed at its laser-light-emission end, whereby the laser unit can be made compact and the distance between the semiconductor laser tip and the laser driving circuit can be shortened.

16 Claims, 6 Drawing Sheets

LASER UNIT

BACKGROUND OF THE INVENTION

1. Field of the Invention

The present invention relates to a laser unit to be used in a laser scanning apparatus for performing an optical writing by using a laser beam, such as a laser beam printer (LBP) and a laser facsimile (FAX) machine.

2. Related Background Art

Conventionally, a laser scanning apparatus for performing an optical writing scan to a photosensitive body or the like, such as a LBP, is constructed as shown in FIG. 1. In FIG. 1, a collimated light beam emitted from a laser unit 30, which is comprised of a laser light source, a collimator lens, a laser driver circuit and the like, is reflectively deflected by a rotating polygonal mirror 31, and a reflectively deflected light beam is scanned on a surface of a photosensitive drum (not shown) through a scanning lens 32 and a return mirror 33.

The collimated light beam is scanned within the width of the drum as a beam optimally condensed by the scanning lens 32. A portion of the scanned beam is reflected by a BD mirror 34 and detected by a BD sensor 35 in order to perform a synchronous detection of the optical writing and prevent a positional shift in the optical writing. A cylindrical lens 37 is generally used to prevent a positional shift in up and down directions (i.e., a sub-scan direction) of the beam on the photosensitive body due to an inclination error of the polygonal mirror surface. Thus, the beam from the laser is condensed with respect to the sub-scan direction on the polygonal mirror surface, and a focused linear image is formed thereon. The polygonal mirror surface and the photosensitive body surface are set conjugate with each other with respect to the sub-scan direction by the scanning lens 32. Further, all those members are mounted onto an optical box 36 within tolerances in size by using reference pins and the like. The laser unit 30 is shown in more detail in FIG. 2.

A semiconductor laser 40 is mounted to a metal base member 45 together with a laser driver circuit 48. At the time of assembly, the base member 45 and a holder 44 are appropriately positioned with respect to a direction of an alignment plane while the laser is driven by the laser driver circuit 48, so that the optical axis of a collimator lens 42 mounted to the side of the holder 44 and a radiation point of a laser tip 41 disposed in a package of the semiconductor laser 40 are aligned with each other, and those members are fixed by screws 47 after the alignment is completed. The alignment contains adjustments in Y—Y' and Z—Z' (in-and-out of the page) directions in FIG. 2. The collimator lens 42 is moved along its optical axis (the X—X' direction) to convert the laser light beam to a collimated beam, and thus the collimator lens 42 is positioned in conjugate relation with the radiation point of the laser tip 41. Therefore, the collimator lens 42 is held in a lens barrel 43 by a push ring 46. Focusing is conducted by moving the barrel 43 along the optical axis (the X—X' direction) in the holder 44, and when alignment is complete, an adhesive is injected through a drip port 49 to fix the lens barrel 43 to the holder 44. Thus, the laser unit 30, which is assembled as a unit, is mounted at a reference position of the optical box 36.

In the prior art apparatus, however, the size of the entire apparatus is difficult to reduce because the laser unit used in the laser scanning apparatus is built by simply assembling a plurality of parts, such as a metal base member and a holder. Furthermore, the laser driver circuit is made up of a print-circuit board on which electronic components are disposed and hence is large in shape. At the same time, the wiring distance for the semiconductor laser is relatively long. As a result, the apparatus is not suited for a high-frequency optical writing in terms of frequency characteristics.

SUMMARY OF THE INVENTION

It is an object of the present invention to provide a laser unit which is compact in size and in which the distance between a semiconductor laser tip and a laser driver circuit 5 is short.

In one aspect, the present invention provides a laser unit in which a semiconductor laser tip, a laser driving integrated circuit (IC) and a collimator lens for condensing a laser light beam from the laser tip are fixed to a common base and the base has a step or slope portion, or a cut-away portion, at a portion of a laser radiation plane end. The base is preferably composed of a metal base in the light of heat radiation.

The present invention has the following features:

1) The number of parts or components is small, compared to the prior art device, and the laser unit is compact in size and easy to assemble;

2) The distance between a semiconductor laser tip and a laser driver circuit can be shortened, and a high-frequency optical writing characteristics of laser light beam is improved; and 3) A laser-radiated beam from the unit can be gathered by a collimator lens without any disturbance because its base has a step or slope portion, or a cut-away portion, at a laser radiation plane end.

The collimator lens is preferably fixed to the base by using an adhesive, such as ultraviolet ray hardening resin.

Furthermore, the base may be a metal base and have an integrally formed hollow portion. Thereby, the semiconductor laser tip can be sealed in the hollow portion, so that the semiconductor laser tip can be protected from dust, moisture and the like.

Moreover, a monitoring photodiode (PHD) for receiving and monitoring a laser light emitted from the semiconductor laser tip may be positioned in a laser driving IC package, so that influence of electric external disturbance noises, which occurs when the distance between the monitoring photodiode and the laser driving IC is relatively long, can be eliminated.

Moreover, a monitoring photodiode for receiving and monitoring a laser light emitted from the semiconductor laser tip may be fixed to the step portion of the metal base for receiving a front laser light beam, so that a stable light-amount monitoring can be achieved irrespective of a change in an ambient temperature and an optical writing with a stable laser light amount can be attained.

These advantages and others will be more readily understood in connection with the following detailed description of the preferred embodiments in conjunction with the drawings.

DESCRIPTION OF THE PREFERRED EMBODIMENTS

Figure 1:
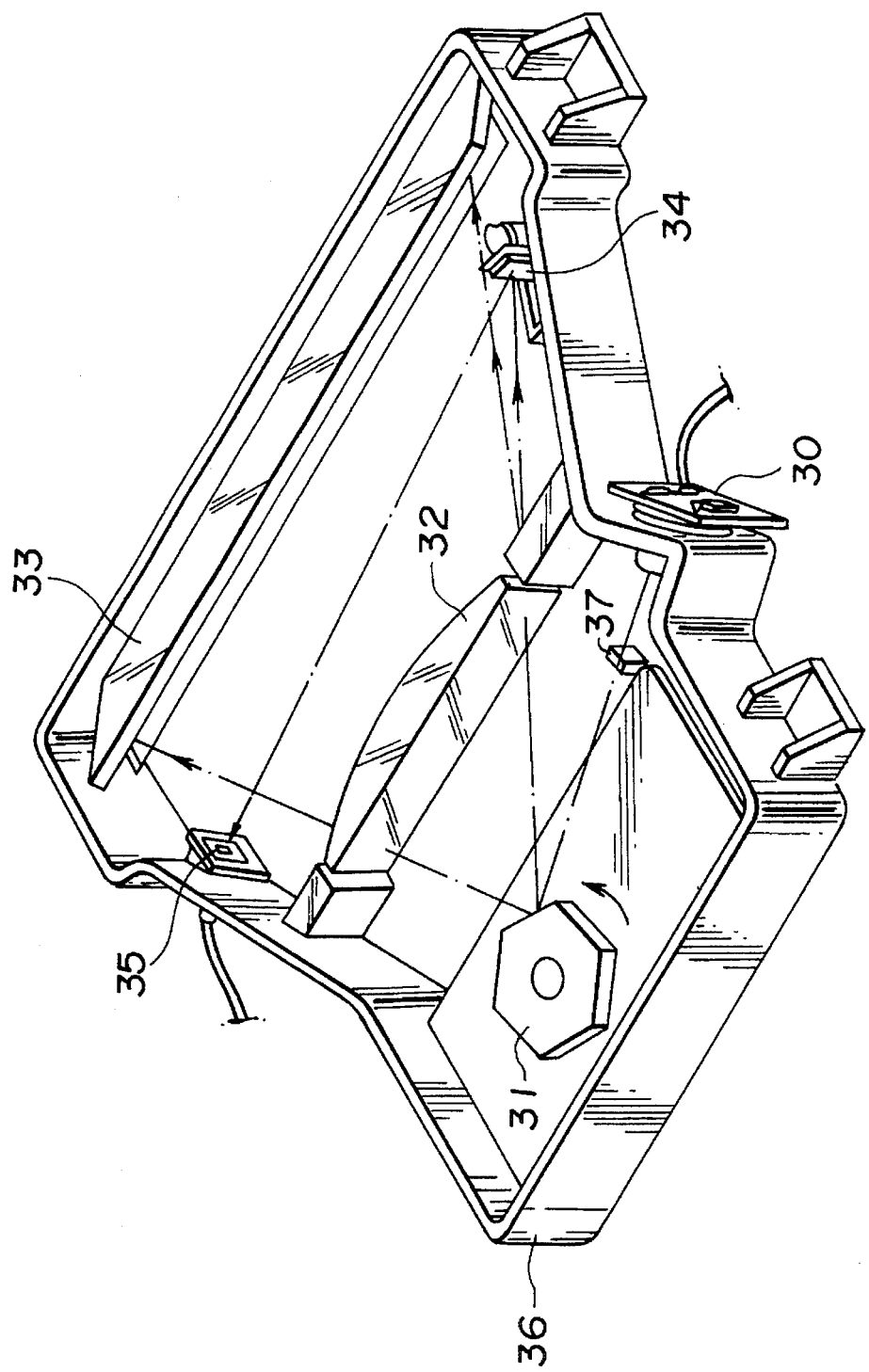
FIG. 1 is a perspective view illustrating a prior art laser scanning apparatus.
Figure 2:
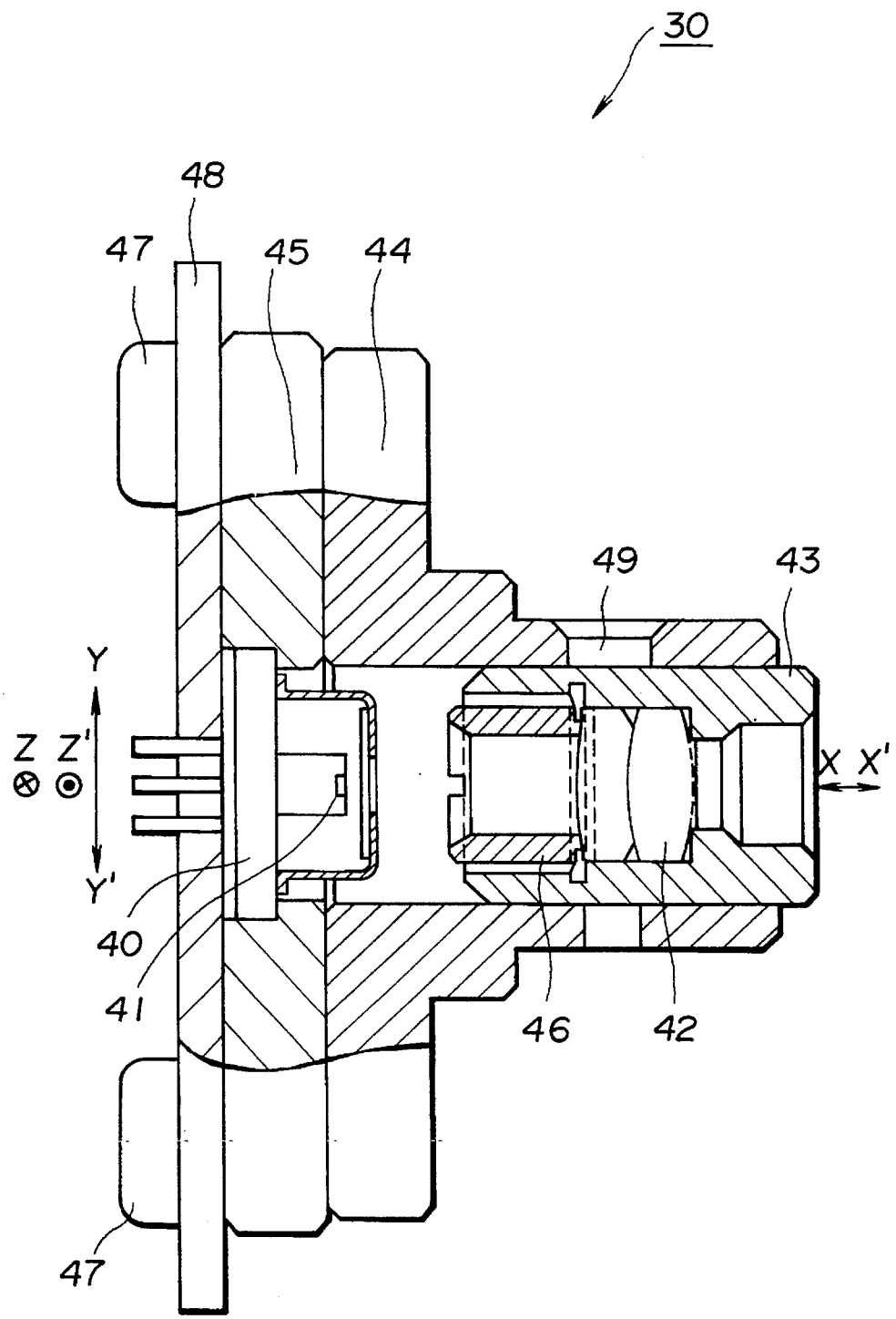
FIG. 2 is a partial sectional view illustrating a prior art laser unit.

Embodiments of the present invention will be hereinafter described with reference to figures.

A first embodiment of a laser unit according to the present invention will be described with reference to FIG. 3.

A semiconductor laser tip 2 radiates a laser beam L. Current is caused to flow in the semiconductor laser tip 2 through a bonding wire 3. The semiconductor laser tip 2 is fixed to an Si substrate 4 by soldering or the like. A monitoring photodiode 5 monitors a laser light beam emitted from the semiconductor laser tip 2 toward its rear side. A laser driving IC 6 is a laser driver circuit for driving the semiconductor laser tip 2. A collimator lens 7 for condensing the laser light beam from the semiconductor laser tip 2 has a skirt portion 7a of a transparent resin around its periphery. A base member 8 is made of a metal, and those components, such as the semiconductor laser tip 2, laser driving IC 6, collimator lens 7 and the like, are fixed to the base member 8 as shown in FIG. 3. The base member 8 has a cut-away portion 9. The collimator lens 7 is fixed to the base member 8 with an adhesive 10. A circuit pattern 11 is formed on the surface of the base member 8 using printing or the like. A group of contact terminals 12 for introducing an electric-source current and a picture-image signal into the laser driving IC 6 are connected to the circuit pattern 11. A stop 13 restricts the diameter of the collimated light beam from the collimator lens 7. The base member 8 has a through hole 14 for guiding a fastening screw. A mount base 20, which is newly formed in the prior art optical box 36, is provided with internal threads 21, reference pins 22 and an electrode pattern 23 formed on its surface.

The semiconductor laser tip 2, Si substrate 4, monitoring diode 5 and laser driving IC 6 are mounted to the base member 8 basically using soldering. The base member 8 is made of metal, such as iron or the like, but may be made of aluminum, zinc or the like. The base member 8 has a mechanical rigidity, and at the same time has a function to radiation-diffuse heat generated by a current flow in the laser driving IC 6. The circuit pattern 11 is formed on the surface of the base member 8 by printing, and a current flow into the laser driving IC 6 and the semiconductor laser tip 2 is achieved through the circuit pattern 11. The semiconductor laser tip 2 is basically soldered to the Si substrate 4, and further solder-fixed to the base member 8 through those solder and Si substrate 4. One of the laser tip's electrodes is connected from the circuit pattern 11 to an upper portion of the semiconductor laser tip 2 using the bonding wire 3, current flows perpendicularly in the semiconductor laser tip 2 and current flows to the other electrode (i.e., from a lower portion of the semiconductor laser tip 2 to the side of the base member 8 through the Si substrate 4). At this time, the Si substrate 4 may be electrically connected to any one of the electrodes of the circuit pattern 11 on the base member 8, but it is simpler to electrically connect the substrate 4 directly to the base member 8 by utilizing the metal base member 8. Further, a current flow into the monitoring photodiode 5 disposed in the neighborhood is also effected by using a bonding wire (not shown), similar to the semiconductor laser tip 2. Herein, one electrode thereof is preferably connected directly to the base member 8, thereby reducing the number of electrodes of the circuit pattern 11. Thus, electric wiring of the laser tip is achieved.

On the other hand, the collimator lens 7 for generating a parallel light beam is fixed to the base member 8 by using adhesive 10. In more detail, the adhesive 10 is an ultraviolet ray hardening resin, and the clearance between the base member 8 and the skirt portion 7a of the collimator lens 7 has such a thickness that a sufficiently thick layer of the adhesive 10 can be generated. The collimator lens 7 is adjusted so that the radiation point of the semiconductor laser tip 2 coincides with the optical axis of the collimator lens 7, while monitoring the emitted light beam L. At the same time, the positioning or focusing for producing the parallel light beam is performed prior to hardening of the adhesive agent 10. Thus, after all the positionings of the optical axis and the focusing are completed utilizing the layer thickness of the adhesive 10, the adhesive 10 is hardened by irradiating the adhesive 10 with ultraviolet light rays through a transparent resin of the skirt portion 7a of the collimator lens 7. For this reason, the skirt portion 7a in the periphery of the collimator lens 7 is made of a resin, such as polycarbonate, and basically transparent for transmitting the ultraviolet light therethrough.

The stop 13 serves to restrict the beam diameter of the collimated light beam, and is adhered to the surface of the collimator lens 7 with an adhesive or the like. The stop 13 is preferably comprised of a thin metal plate or a thin plastic plate. The stop 13 preferably has a diameter sufficiently larger than the diameter of the collimator lens (for example, more than 1.2 times) so that flare and the like spreading around the periphery of the transparent collimator lens 7 are intercepted and do not leak toward a deflector, such as a polygonal mirror for directing the collimated light beam, and a scanning lens, as far as possible.

In one feature of this embodiment, the base member 8 has a cut-away portion 9 having a rectangular C shape in the vicinity of the semiconductor laser tip 2. Due to such a structure, the laser light beam L, which is emitted from the semiconductor laser tip 2 spreading in a conical shape, is prevented from being reflected by the surface of the base member 8, and thus a sufficient amount of the light beam can enter the collimator lens 7. Further, light will not be reflected by those surfaces and be scattered as flare. Although the semiconductor laser tip 2 is basically exposed to the air, a passivation coating made of a material, such as an silicon oxide and an aluminum oxide, is provided on the entire tip 2 to increase resistivity against oxidization and improve environmental characteristics. Conventionally, the passivation coating for protecting the tip surface against oxidization is provided only on two laser-radiation planes (i.e., planes at sides of the collimator lens 7 and the laser driving IC 6) of the semiconductor laser tip 2.

Figure 4:
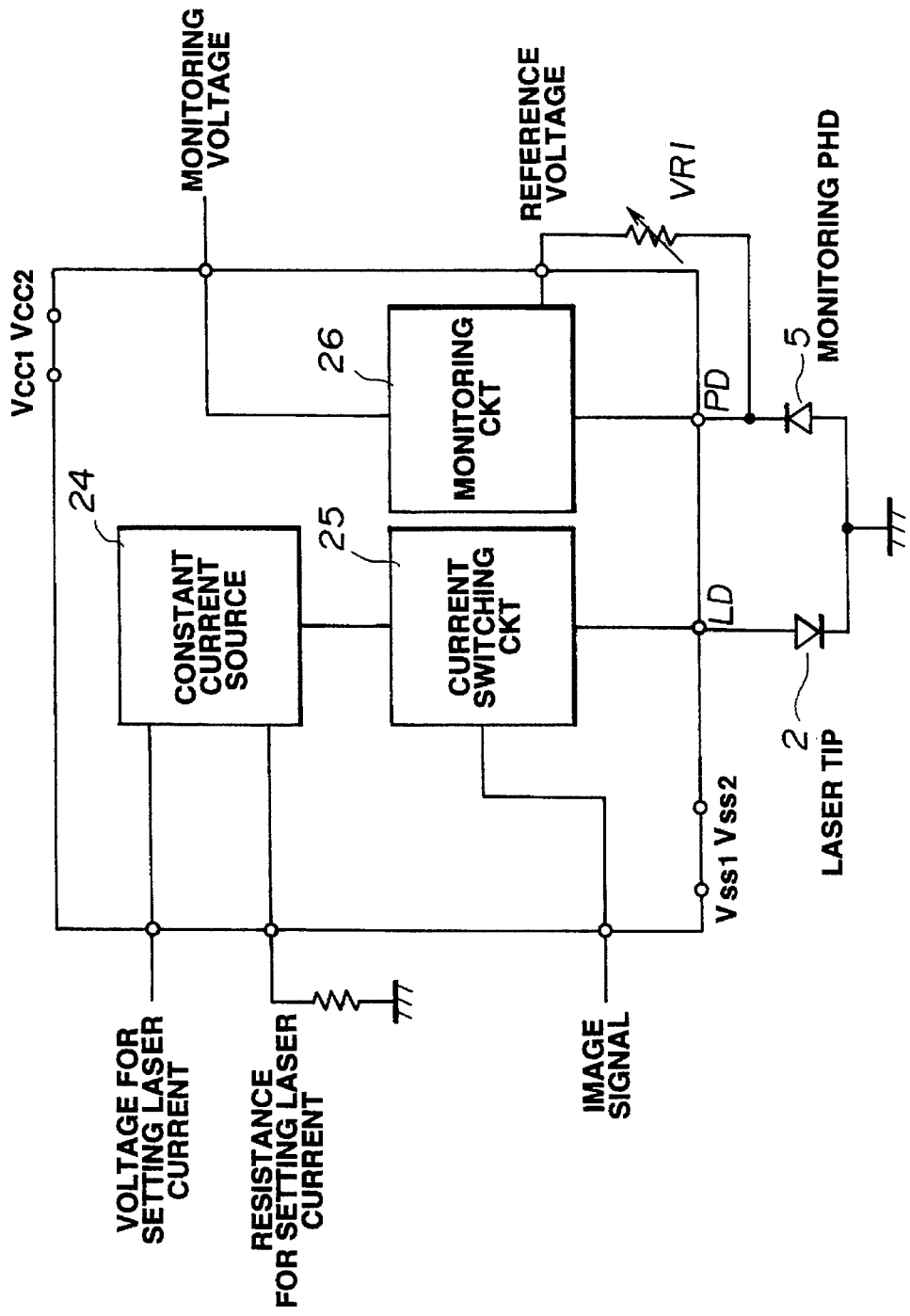
FIG. 4 is a circuit diagram of a laser driving IC 6.

FIG. 4 is a circuit diagram of the laser driving IC 6. The laser driving IC 6 is composed of a constant current source 24, a current switching circuit 25, a monitoring circuit 26 and the like, and the output of the monitoring photodiode 5 is utilized for an automatic light-amount adjusting action, which is performed by the monitoring circuit 26, to maintain the laser radiation amount at a constant magnitude. When ordinary optical writing is conducted on the photosensitive body, the current flow into the semiconductor laser tip 2 is controlled by the current switching circuit 25 so that an on-and-off radiation of the semiconductor laser tip 2 is achieved according to a picture-image signal.

Figure 3:
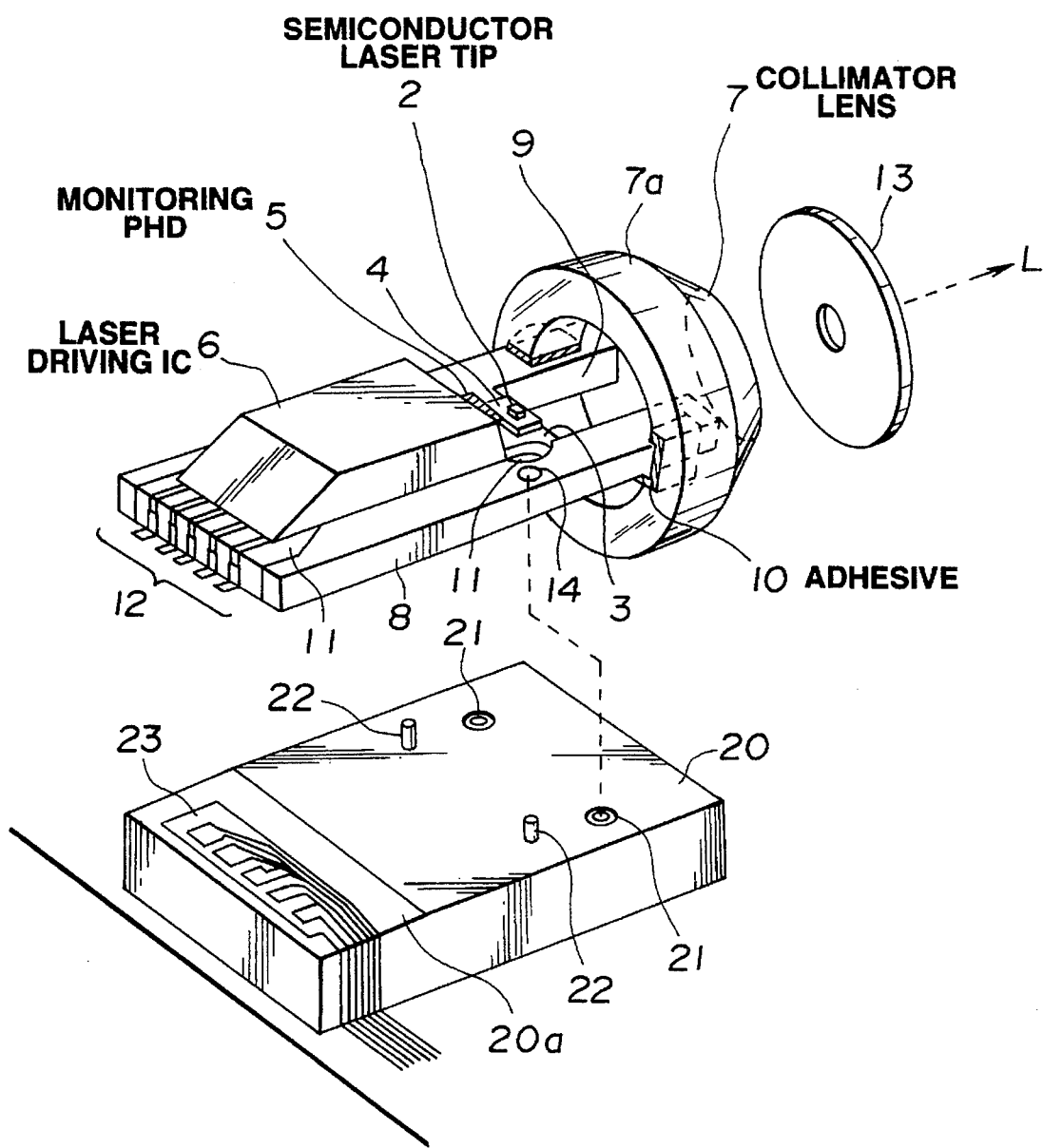
FIG. 3 is a perspective view illustrating a first embodiment of a laser unit of the present invention.

The group of contact terminals 12 shown in FIG. 3 serve as terminals for receiving those picture-image signal, current supplied by a source and the like from an external controller. A laser unit, which is constructed by adjusting and assembling all those components, such as the laser driving IC 6, the semiconductor laser tip 2, the collimator lens 7 and the like, is fixed to the optical box 36 as described in the prior art apparatus. The thus-constructed laser unit is positioned and fixed to the mount base 20 from above, using the reference pin 22, as shown in FIG. 3. The mount base 20 is integrally formed with the optical box 36 made of a material such as glass-added polycarbonate. Fixing is achieved by fastening a screw to the bit-inserted internal thread 21 through the through hole 14 of the base member 8. Flatness and the like of the mount base 20 are ensured by using its upper plane as a mount reference plane. A small, low step 20a is formed at the end portion of the mount base 20, and the electrode pattern 23 is formed there by printing or the like. The electrode pattern 23 is fixed to the group of contact terminals 12 by soldering, and thus they are electrically connected to each other. Thus, the laser unit is finally fixed to the optical box 36.

The first embodiment is advantageous in that a laser light beam emitted from the semiconductor laser tip 2 spreading towards the collimator lens 7 is not intercepted and can be taken out as a necessary collimated beam since the base member 8 is provided with the rectangular C-shaped cutaway portion 9.

In the first embodiment, the size of the laser unit is more compact, compared to the prior art apparatus, even when a portion without the collimator lens 7 is compared. Moreover, the distance between the semiconductor laser tip 2 and the laser driving IC 6 is set to a minimum value so that electric frequency characteristic can be improved. Therefore, even if the collimator lens 7 is mounted in a different manner, or to a separate member for a reason in design or the like, the above-described effect can be similarly achieved. Furthermore, the semiconductor laser tip 2 and the laser driving IC 6 are mounted to the base member 8 as a unit, and hence compactness is attained. As a result, there in more freedom in design of the entire apparatus because a setting location and a space for the semiconductor laser tip 2 and the laser driving IC 6 are not limited.

Figure 5:
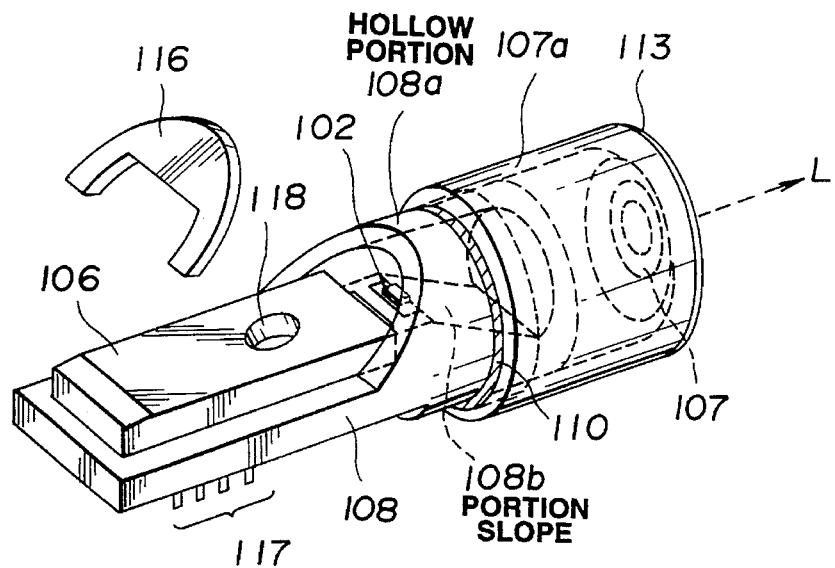
FIG. 5 is a perspective view illustrating a second embodiment of a laser unit of the present invention.
Figure 6:
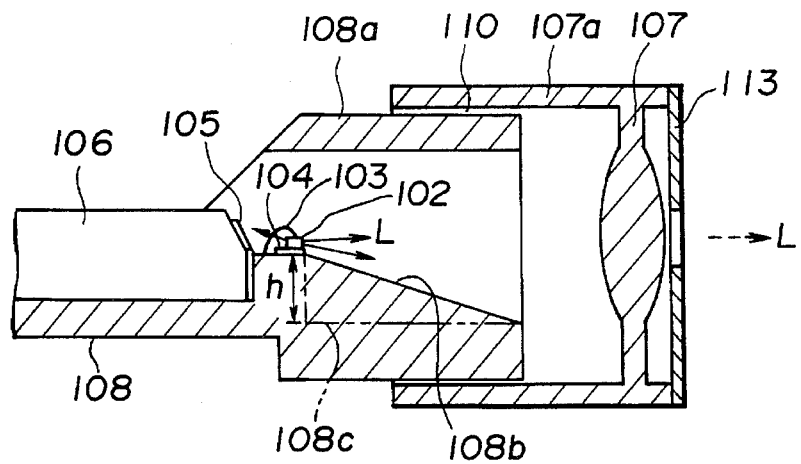
FIG. 6 is a partial sectional view illustrating the laser unit shown in FIG. 5.

FIG. 5 is a perspective view of a second embodiment of a laser unit of the present invention, and FIG. 6 is a partial cross-sectional view of the second embodiment.

A collimator lens 107 is provided with a transparent skirt portion 107a, which has an elongated cylindrical shape, at its outer periphery. A metal base member 108 has a hollow portion 108a which is integrally formed by a die-cast method. In the hollow portion 108a, a slope portion 108b, which is formed by cutting slantingly from an end surface for mounting a semiconductor laser tip 102, is formed integrally with the base member 108. The base portion 108 is sealed by a sealing cap 116. A photodiode 105 is assembled in a common package together with a laser driving IC 106. A group of contacts 117 is drawn out directly from the laser driving IC 106, and is directed outside through a hole formed in a lower portion of the base member 108. The function thereof is the same as the group of contact terminals 112 of the first embodiment. A through hole 118 is formed inside of the laser driving IC 106. Other reference numerals of the second embodiment designate similar members or potions as those of the first embodiment.

In this embodiment, similar to the first embodiment, the semiconductor laser tip 102 is soldered to the base member 108 through the Si substrate 104 or the like. The hollow portion 108a covers the outside of the semiconductor laser tip 102 to protect it from dust, moisture and the like contained in the air.

The collimator lens 107 is fixed to the base member 108 by fitting the outer peripheral portion of the hollow portion 108a into the transparent resin skirt portion 107a of the collimator lens 107 and by using an adhesive 110 of ultraviolet ray hardening resin. At this time, similar to the first embodiment, the radiation point of the semiconductor laser tip 102 is adjusted on the optical axis of the collimator lens 107, and the focus adjustment thereof is accomplished at the same time. When the curing is performed using ultraviolet light rays, sealing from the air is achieved by filling an entire region between the hollow portion 8a and the skirt portion 107a with the adhesive 110 without any clearance.

On the other hand, the end of the hollow portion 108a is slantingly cut at the rear side of the semiconductor laser tip 102 so as to facilitate the mounting of the semiconductor laser tip 102 into the hollow portion 108a. Further, the laser driving IC 106 is mounted as close as possible to the semiconductor laser tip 102 in order to shorten a wiring distance therebetween. In this second embodiment, the laser driving IC 106 has a monitoring photodiode 105 whose package is integral with the laser driving IC 106. Thus, influence of electric external disturbance noises, which occurs when the clearance between the monitoring photodiode 105 and the laser driving IC 106 is relatively large, is diminished as far as possible. The sealing cap 116 is adhered to the slantingly cut end surface of the hollow portion 108a and a portion of the outer shape of the laser driving IC 106 in contact therewith, so that the environment of the semiconductor laser tip 102 is sealed against the air. In order to reduce the number of components, the outer shape of the laser driving IC 106 may be made coincident with the shape of the end surface of the hollow portion 108a and they may be directly adhered to each other without using the sealing cap 116.

A passivation layer is provided on the entire surface of the semiconductor laser tip 102 to prevent degradation due to oxidization of the tip 102, but the passivation layer may be provided only on the emission end surfaces of the semiconductor laser tip 102 as is done in the prior art apparatus. In the latter case, dried inert gas, such a nitrogen gas, may be introduced into the sealed hollow portion 108a to prevent oxidization. Further, in the second embodiment, the slope portion 108b is formed so as not to intercept the radiated laser beam spreading from the semiconductor laser tip 102 toward the collimator lens 107. Thus, loss of the light caught by the collimator lens 107 is eliminated. The angle of the slope of the slope portion 108b relative to the optical axis is preferably equal to, for example, about more than ten (10) degrees. Instead of the slope portion 108b, a step portion 108c may be formed, as shown by dotted lines in FIG. 6, by cutting the end portion for mounting the semiconductor laser tip 102. In this case, h/f is preferably set to over 0.2 where f is a focal length of the collimator lens 117 and h is a height of a stepped end portion as shown in FIG. 6.

Further, the step portion may be replaced by plural-step portions (like stairs) or an arcuately cut portion. In this case, the same effect can be obtained when material is cut away so as to remove a region at an angle larger than the slope portion 108b. The thus-constructed laser unit is fixed to the mount base 20, which is integrally formed with the optical box, by using screws, similar to the first embodiment. Also similar to the first embodiment, positioning is achieved by the reference pins 22, and the fastening screw is penetrated through the through hole 118 of the laser driving IC 106 to fix the entire unit. Here, only one screw is needed, and the fastening is conducted at the central portion of the base member 108. Further, the group of contact terminals 117 projecting from the lower portion of the laser driving IC 106 are brought into contact with corresponding terminals of the electrode pattern 23 of the mount base 20 through the hole (not shown) formed in the base member 108. In this case, when those terminals are so-called contact leads (not shown) having resiliency, mounting can be readily achieved.

In this second embodiment, features are as follows: the slope or step portion 108a or 108c is formed at the end portion of the base member 108, where the semiconductor laser tip 102 is mounted, to make a parallel light beam from the laser light beam radiated from the semiconductor laser tip 102 toward the collimator lens 107, without intercepting the laser beam. Further, the hollow portion 108a is integrally formed in the base member 108 in order to protect the semiconductor laser tip 102. Moreover, the photodiode 105 is buried in the laser driving IC 106 so that the structure is greatly resistive to external disturbance noises. Naturally, the structure is not limited to the precise arrangement of the second embodiment. For example, the laser driving IC 106 may be combined with the laser unit of the first embodiment according to the needs of the design.

Figure 7:
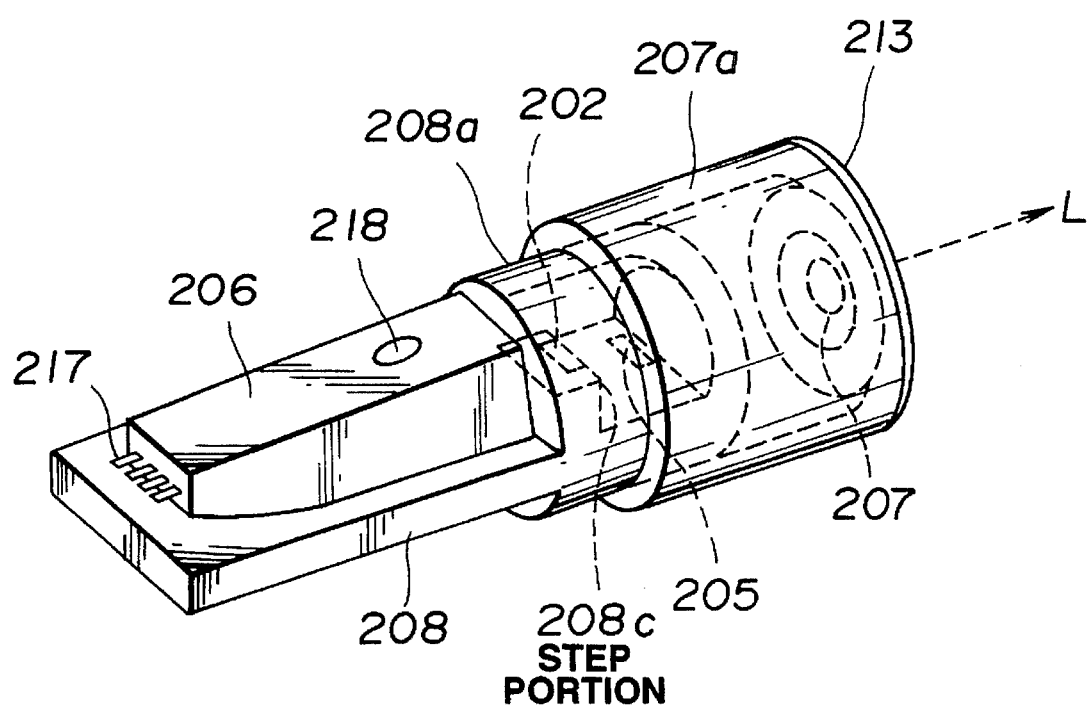
FIG. 7 is a perspective view illustrating a third embodiment of a laser unit of the present invention.

FIG. 7 shows a laser unit of a third embodiment of the present invention. In FIG. 7, a monitoring photodiode 205 receives a part of a laser light emitted from a semiconductor laser tip 202 toward a collimator lens 207. Reference numeral 217 designates a group of contact terminals drawn out directly from a laser driving IC 206. Other reference numerals designate similar members or portions as those of the above embodiments.

The structure and assembly of a laser unit of the third embodiment are basically the same as those of the above embodiments. The semiconductor laser tip 202, the laser driving IC 206, the collimator lens 207 and the like are movably fixed to a metal base member 208 while performing adjustment, by using soldering and adhesive, such as ultraviolet ray hardening resin. The monitoring photodiode 205, which always monitors an amount of the laser light beam from the semiconductor laser tip 202 to maintain the light amount at a constant magnitude, is disposed in such a manner that the photodiode 205 receives a front laser light emitted from the semiconductor laser tip 202 toward the side of the collimator lens 207. For this purpose, the monitoring photodiode 205 is buried in a surface of a step portion 208c of the base member 208, and its electrodes are electrically connected to the laser driving IC 206 through printed wires on the step portion 208c.

In general, the semiconductor laser tip 202 radiates two laser beams: one from the front end (i.e., toward the side of the collimator lens 207) and one from the rear end (i.e., the side of the laser driving IC 206), and those two beams change at substantially the same rate when a laser driving current changes. However, it is known that those change rates become slightly different from each other when the ambient temperature of the semiconductor laser tip 202 changes largely. Therefore, the monitoring photodiode 205 is located so that a part of the front laser beam can be received thereby, in order to accurately monitor the light amount even when the change in that ambient temperature is great. The monitoring photodiode 205 is of course located so as not to intercept the laser beam which is received by the collimator lens 207 and a stop 213, and in the second embodiment it may be located in the step portion 108b. With that arrangement, the photodiode receives only part of the spreading laser light beam emitted from the semiconductor laser tip. In the third embodiment, the outer shape portion of the laser driving IC 206 is directly adhered to the end portion of the hollow portion 208a to seal it inside. As a result, the number of components is reduced, as described above. Further, the group of contact terminals 217 is drawn from the side end portion of the laser driving IC 206, and prepared for connection with ordinary covered conductor or the like. Similar to the above embodiments, the laser unit is positioned and fixed to the mount base 20, which is integrally formed in the optical box, by screws.

The third embodiment is advantageous in that the monitoring photodiode 205 is disposed at the step portion 208c to receive a part of the laser light beam emitted by the semiconductor laser tip 202 toward the collimator lens 207 so that a stable light-amount monitoring is achieved irrespective of a change in temperature and an optical writing with a stable laser light amount can be attained.

The above-discussed laser unit of the present invention can be used as the laser unit 30 of the laser scanning apparatus as shown in FIG. 1, and the size of the entire laser scanning apparatus can be made compact. Further, high-frequency writing characteristics of a laser light beam can be improved.

As described in the foregoing, the present invention has the following advantageous effects:

1) A semiconductor laser tip, a laser driving integrated IC and a collimator lens for condensing a laser light beam from the semiconductor laser tip are fixed to a common metal base member, and the base member has a step or slope portion, or a cut-away portion, at a portion of a laser radiation plane end. As a result, the size of a laser unit can be made compact, high-frequency writing characteristics of a laser light beam can be improved and the laser beam can be taken out from the collimator lens without any interception.

2) The collimator lens is fixed to the metal base by using an adhesive, such as ultraviolet ray hardening resin, so that the position of the collimator lens can be readily adjusted.

3) The metal base have an integrally formed hollow portion, and the semiconductor laser tip is sealed in the hollow portion, so that the semiconductor laser tip can be protected from dust, moisture and the like.

4) A monitoring photodiode for receiving and monitoring a laser light emitted from the semiconductor laser tip is positioned in a laser driving IC package, so that influence of electric external disturbance noises can be eliminated.

5) The monitoring photodiode for receiving and monitoring a laser light emitted from the semiconductor laser tip is fixed to a step portion of the metal base for receiving a front laser light beam, so that a stable light-amount monitoring can be achieved irrespective of a change in the ambient temperature and an optical writing with a stable laser light amount can be attained.

Except as otherwise disclosed herein, the various components shown in outline or block form in the Figures are individually well known in the laser unit and laser scanning device arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A laser unit comprising:

a semiconductor laser tip;

a laser driving integrated circuit for driving said semiconductor laser tip;

a condenser lens for condensing a laser light beam emitted by said semiconductor laser type; and a single base, said semiconductor laser tip, said laser driving integrated circuit and said condenser lens being mounted to said base, wherein said base contains a hollow portion therein, and wherein said semiconductor laser tip is mounted in said hollow portion and sealed therein.

2. A laser unit according to claim 1, wherein said condensor lens comprises a collimator lens.

3. A laser unit according to claim 1, wherein said base comprises a metal member.

4. A laser unit according to claim 1, wherein said base includes one of a step portion and a cut-away portion at a laser-light-emission end of said base.

5. A laser unit according to claim 1, wherein said condensor lens is fixed to said base using an adhesion of ultraviolet hardening resin.

6. A laser unit according to claim 1, further comprising a photodiode for receiving and monitoring a laser light beam emitted from said semiconductor laser tip, said photodiode being disposed in a package of said laser driving integrated circuit.

7. A laser unit according to claim 1, further comprising a photodiode for receiving and monitoring a laser light beam emitted from said semiconductor laser tip.

8. A laser unit according to claim 7, wherein said base includes one of a step portion and a cut-away portion at a laser-light-emission end of said base, and wherein said photodiode is disposed at said step or cut-away portion.

9. A laser scanning apparatus comprising:

a laser unit, said laser unit comprising a semiconductor laser tip, a laser driving integrated circuit for driving said semiconductor laser tip, a condenser lens for condensing a laser light beam emitted by said semiconductor laser tip, said laser driving integrated circuit and said condenser lens being mounted to said base, wherein said base contains a hollow portion therein, and wherein said semiconductor laser tip is mounted in said hollow portion and sealed therein; and scanning means for deflectively scanning the condensed laser light beam.

10. A laser scanning apparatus according to claim 9, wherein said condenser lens comprises a collimator lens.

11. A laser scanning apparatus according to claim 9, wherein said base comprises a metal member.

12. A laser scanning apparatus according to claim 9, wherein said base includes one of a step portion and a cut-away portion at a laser-light-emission end of said base.

13. A laser scanning apparatus according to claim 9, wherein said condenser lens is fixed to said base using an adhesion of ultraviolet hardening resin.

14. A laser scanning apparatus according to claim 9, further comprising a photodiode for receiving and monitoring a laser light beam emitted from said semiconductor laser tip, said photodiode being disposed in a package of said laser driving integrated circuit.

15. A laser scanning apparatus according to claim 9, further comprising a photodiode for receiving and monitoring a laser light beam emitted from said semiconductor laser tip.

16. A laser scanning apparatus according to claim 15, wherein said base includes one of a step portion and a cut-away portion at a laser-light-emission end of said base, and wherein said photodiode is disposed at said step or cutaway portion.

* * * * *

UNITED STATES PATENT AND TRADEMARK OFFICE
CERTIFICATE OF CORRECTION

PATENT NO. : 5,490,158

DATED : February 6, 1996

INVENTOR(S): Shin Mogi

It is certified that error appears in the above-identified patent and that said Letters Patent is hereby corrected as shown below:

Item [56]
On the cover page, under "Foreign Patent Documents", change
```
     "1077985   3/1989    Japan
      3148190   6/1991    Japan
      3245586  11/1991    Japan" to
    --1-077985    3/1989    Japan
      3-148190    6/1991    Japan
      3-245586   11/1991    Japan--.
```

Column 2, line 11, delete "5"; and

Column 5, line 2, change "those" to --the--.

Column 7, line 1, ".IC" to --IC--.

UNITED STATES PATENT AND TRADEMARK OFFICE
CERTIFICATE OF CORRECTION

PATENT NO. : 5,490,158

DATED : February 6, 1996

INVENTOR(S) : Shin Mogi

It is certified that error appears in the above-identified patent and that said Letters Patent is hereby corrected as shown below:

```
        Column 9, line 7, change "type;" to --tip;
                 line 15, change "densor" to --denser--;
and
                 line 22, change  "densor" to --denser--.

Column 10, line 34, change "cutaway" to --cut-
away--.
```

Signed and Sealed this

Twenty-fifth Day of June, 1996

Attest:

BRUCE LEHMAN

*Attesting Officer*            *Commissioner of Patents and Trademarks*